United States Patent
Uusimäki

(12) 
(10) Patent No.: US 6,508,663 B1
(45) Date of Patent: Jan. 21, 2003

(54) ARRANGEMENT AND METHOD FOR FORMING AN ELECTRICAL CONTACT IN AN ELECTRONIC DEVICE

(75) Inventor: Matti Uusimäki, Sahalahti (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/669,216

(22) Filed: Sep. 25, 2000

(30) Foreign Application Priority Data

Sep. 29, 1999 (FI) .............................................. 19992081

(51) Int. Cl.$^7$ ................................................. H01R 3/00
(52) U.S. Cl. ........................................ 439/500; 439/627
(58) Field of Search ................................. 439/500, 626, 439/627, 929, 68, 66, 21; 310/324, 345, 356

(56) References Cited

U.S. PATENT DOCUMENTS

| | | | |
|---|---|---|---|
| 4,273,399 A | * 6/1981 | Myers et al. | 439/74 |
| 4,965,483 A | * 10/1990 | Abe et al. | 310/324 |
| 5,213,513 A | * 5/1993 | Brown et al. | 439/68 |
| 6,142,823 A | * 11/2000 | Ishibashi | 439/500 |

FOREIGN PATENT DOCUMENTS

| | | |
|---|---|---|
| EP | 0490214 B1 | 6/1992 |
| EP | 0567850 | 11/1993 |
| WO | WO 97/29528 | 8/1997 |

\* cited by examiner

*Primary Examiner*—Tulsidas Patel
(74) *Attorney, Agent, or Firm*—Perman & Green, LLP

(57) ABSTRACT

The invention relates to a method and an arrangement in an electronic device, for coupling a component (T), such as an electroacoustic transformer, electrically to a circuit board (B) by means of a contact (2b) between a contact spring (3b) and a contact surface (4b). In the invention, the arrangement comprises, for different rotary positions of the component (T), at least one alternative contact (2c) between a contact spring (3b, 3c) and the contact surface (4b). The invention also relates to an electronic device comprising the arrangement, as well as an electroacoustic transformer. In one embodiment, the arrangement comprises at least two separate contact springs (3b, 3c) which are arranged in such a way that simultaneously at least one of the contact springs (3b, 3c) forms a contact (2b, 2c) with the contact surface (4b). In one embodiment, the contact surface (4b) is formed as a conductive, annular surface comprising at least one point of discontinuity (Da).

16 Claims, 5 Drawing Sheets

ARRANGEMENT AND METHOD FOR FORMING AN ELECTRICAL CONTACT IN AN ELECTRONIC DEVICE

BACKGROUND OF THE INVENTION

1. Field of the Invention

This invention relates to an arrangement for an electronic device for electrically coupling a component to a circuit board. The invention also relates to an electroacoustic transformer having a unique structure. Furthermore, the invention relates to a wireless communication device comprising an arrangement for electrically coupling a component to a circuit board. In addition the invention relates to a method for the electrical coupling of a component to a circuit board in an electronic device.

2. Description of the Prior Art

In a known manner, various electronic devices incorporate printed circuit boards (PCB) which are provided with electronic circuits, such as integrated circuits (IC), to control the operation of the devices and which contain printed conductive patterns to couple the circuits electrically to each other for the transmission of signals. These circuit boards can also be multilayer printed circuit boards, wherein the wirings extend between two board layers and the connection through one or several board layers is implemented with through holes.

Said devices often also incorporate components which must be installed separately and electrically coupled to the circuit board and further to the circuits fixed on the circuit board. For example in wireless communication devices, such as mobile phones, such components are electroacoustic transformers which convert an electrical signal to an acoustic signal, normally to an audible sound, or vice versa. Transformers include earpieces, microphones, buzzers, and various speakers. It is typical that the devices comprise several cover parts which are fitted with the circuit board and equipped with the separate components and which cover parts are fixed to each other during the assembly. In the fixing, an electrical coupling must be produced between the conductive patterns of the circuit board and the components, to make the operation of the device possible.

In patent publication EP 0 490 214 B1, an electrical contact between a circuit board and an electroacoustic transformer is produced by means of a spring-like means, i.e. a contact spring. The contact spring is fixed with jaw to the contact of the transformer, and it also touches the circuit board, normally a conductor, such as a microstrip, arranged in the circuit board. Patent publication EP 0 567850 B1 presents a solution in which a part operating in a spring-like manner is fixed by penetration into the circuit board, and a tag in the transformer is fitted between jaws. In this solution, the transformer and the spring-like part are in a fixed position in relation to each other and the circuit board; furthermore, careful position of the transformer is required in the assembly. Also known is a connector presented in publication WO 97/29528 for coupling a transformer electrically to a circuit board. This solution, however, applies a separate connector component fixed to the circuit board and comprising spring-like means which further constitute the contact with strips arranged in the transformer. The spring-like means are further coupled to the conductors of the circuit board. Also in this solution, the transformer and the connector are in a fixed position in relation to each other and the circuit board.

According to the patent publication EP 0 490 214 B1, the transformer normally comprises two separate connectors, i.e. contacts, implemented for example with contact springs, for the transmission of two different signals. Thus, also the conductors of the signals must be electrically separated from each other on the circuit board. Typically, a circular transformer is allowed to rotate into different positions when it is installed in its position in a nest fitted in the device and its cover. For this reason, the first contact spring is usually located centrally in the transformer and the second contact spring is located closer to the edge of the transformer. For the second contact spring, the circuit board is normally equipped with a circular contact surface arranged in the form of an endless ring, for example a strip conductor with an even width. For the first contact spring, the circuit board is normally equipped with a circular second contact surface, e.g. a strip conductor, formed in the center of the circular contact surface.

To bring the second contact surface into an electrical contact with a third strip conductor fitted on the circuit board past the first contact surface, a fourth strip conductor is formed on the second surface or between the board layers of the circuit board, connected e.g. by through-holes with the second contact surface and the third strip conductor. The second contact surface can be directly connected to something, for example a fifth strip conductor, which is fitted together with the annular and circular contact surfaces on the surface of the circuit board.

The above-presented case involves, however, the problem that the circuit board must be provided with strip conductors on at least two different levels, which makes the manufacture of the circuit board considerably longer and more complicated; moreover, one must use more expensive multilayer printed circuit board, and the alternatives for the material of the circuit board are limited. Also known is a foil-like flexible printed board which is made of e.g. polyamide and which consists of a flexible base material. Moreover, a so-called flexible conductor cable is known, which consists of a flexible base material and conductors on its surface. The material of the conductive patterns is generally a copper film. In a part of the flexible material, it is possible to form several layers, but in this case this part is not resistant to bending, which restricts the placing of the circuit board. It is possible to construct several layers in only part of the flexible circuit board, but this makes the manufacturing process considerably more complicated and longer in time.

In a known manner, attempts have been made to overcome the above-presented problem in such a way that the annular first contact surface is provided with a point of discontinuity, such as an opening, through which the second contact surface is coupled to other strip conductors, e.g. by means of said fourth conductor. It is thus possible to use contact surfaces and strip conductors formed on only one surface of the circuit board. This solution sets, however, special requirements on the installation, because the second contact spring which is intended to make a contact with the first contact surface must not make a contact with said fourth conductor or hit a location with an opening or insulated area in the first contact surface. In many cases, a transformer can be fitted in the cover part of the device, or a like, in only one position, which, however, restricts the placement of the contact surfaces on the circuit board and the use of different transformer models. Furthermore, the final position must also be taken into account at an early stage in the manufacture of the cover parts and/or the transformers. This will result in problems of compatibility and mounting faults, or malfunction of the device will be due to a displacement of the transformers during the use.

The above-mentioned fourth strip conductor can also be conveyed above or underneath the endless first contact surface, but in this case several layers and insulators must be formed on the surface of the circuit board to isolate the strip conductor and the contact surface from each other and/or from the second contact spring, which makes the structure and its manufacture more complex. If the fourth strip conductor is conveyed above the contact surface and isolated, an opening of the above-mentioned kind is formed again in the first contact surface.

SUMMARY OF THE INVENTION

It is an aim of the present invention to eliminate the above-mentioned drawbacks and to produce an arrangement which limits the transformer, the mounting of the transformer, as well as the manufacture and position of the contact surfaces as little as possible, preferably to couple an electroacoustic transformer and the circuit board electrically to each other.

The central principle of the invention is that the transformer is provided with at least two contact springs which are, in view of the use and the transmission of the electrical signal, alternative to each other, for the above-described annular contact surface. The contact springs are fitted in such a way that irrespective of the rotary position of the transformer and irrespective of the location of the discontinuity of the annular contact surface, at least one contact spring always forms a connection, i.e. a contact, to the annular contact surface. At the same time, the other contact springs hit e.g. opening locations or insulators but not a contact with the other contact surfaces. The other contact springs can also be located on an insulator which is placed above another contact surface or strip conductor.

The invention gives considerable advantages to the prior art. The rotary position of the transformer can be even completely free, if the contact springs are placed in a centralized and annular way. In case there are several alternative predetermined positions that can be selected for the transformer, the position can still be selected from these even completely freely. The mounting will be considerably easier and faster, and the devices or transformers do not need to be equipped with forms or parts which force the transformer in a desired position. Consequently, it is only necessary in the device to secure that the component, such as a transformer, and the contact surfaces of the circuit board face each other, e.g. centrally, and at a desired distance from each other. With the invention, the direction of the opening in the contact surface can be selected even completely freely, because the rotary position of the transformer does not affect the functionality of the device. Thus, the direction of the opening on the circuit board can be varied among different devices according to the need.

It is a particular advantage of the invention that, with the arrangement, it is also possible to use a flexible circuit board whose one surface is provided with the necessary contact surfaces, insulation layers and strip conductors. The use of a flexible circuit board facilitates particularly the construction of small electronic devices and increases the possibilities of space utilization for reducing the size of the device further, if necessary. Another advantage is that even though the transformer is arranged according to the invention, its functioning is still possible also with most previously known circuit board arrangements and designs of contact surfaces. Thus, even new transformer models are compatible with old devices.

Another particular advantage is easy expansibility, wherein it is also suitable for transformers which require e.g. three or more separate signal connections and contacts to the contact surfaces of the circuit board, which connections and contacts are electrically separated from each other. Thus, the circuit board is provided with a central round continuous contact surface, around the same an annular contact surface cut with an opening, and further around this an annular contact surface cut with an opening. The cutting points are used to lead the strip conductors of the innermost contact surfaces which are covered with an insulator, if necessary, to form a connection elsewhere in the circuit board.

The number of contact springs of the component for each annular contact surface depends on the length of the circumference of the surface, particularly its sector angle, wherein when the contact surface comprises one opening and covers at least half of the periphery of a circle (sector angle more than 180 degrees), there must be at least two contact springs. When the contact surface covers at least one third of the periphery of a circle (sector angle more than 120 degrees), there must be at least three contact springs. When the contact surface comprises additional openings, each contact spring must be provided with at least one pair at a distance which is greater than the width of the opening. On the other hand, the distance of the springs must be different from the distance of the openings. Thus, at least one contact spring of the pair always forms a contact with the surface.

For example a strip-like or wire-like contact spring can be, alternatively, arranged or formed so wide that its contact extends from the opening to the contact surface. The contact spring can also be designed to have two or more points with the shape of e.g. a V or U, each point forming a contact and the distance between the points being greater than the size of the opening. This has the advantage that the transformer does not need to be connected to several contact springs or provided with several strip-like or pin-like connectors for the contact springs. The second point is also used for backup.

As an advantage of the invention, it can also be particularly mentioned that the contact surfaces can also be provided in the transformer and the contact springs can be placed on the circuit board by grouping according to the invention, which further increases the various structural alternatives. The transformer and the circuit board can also be fitted with both contact surfaces and contact springs. The different solutions yield the significant advantage that in each case, it is possible to select very freely the economically and technically most suitable alternative.

Furthermore, the invention can be applied in the coupling of other electrical components, such as light emitted diode (LED) and several coupling elements, for example pressbutton switches. By means of the invention, also these components can be arranged to be symmetrical, particularly circular, and to have a free mounting position, because the contact can be secured in the different rotary positions of the component. By means of the invention, it is also possible to eliminate the selection of the position of present symmetrical components to be located in different positions, or arrangements for guiding the position, to make the assembly faster and simpler. The invention is thus particularly well suited for assembling components by machine.

DESCRIPTION OF THE DRAWINGS

In the following, the invention will be described in more detail with reference to the appended drawings, in which.

DETAILED DESCRIPTION OF THE INVENTION

Figure 1:
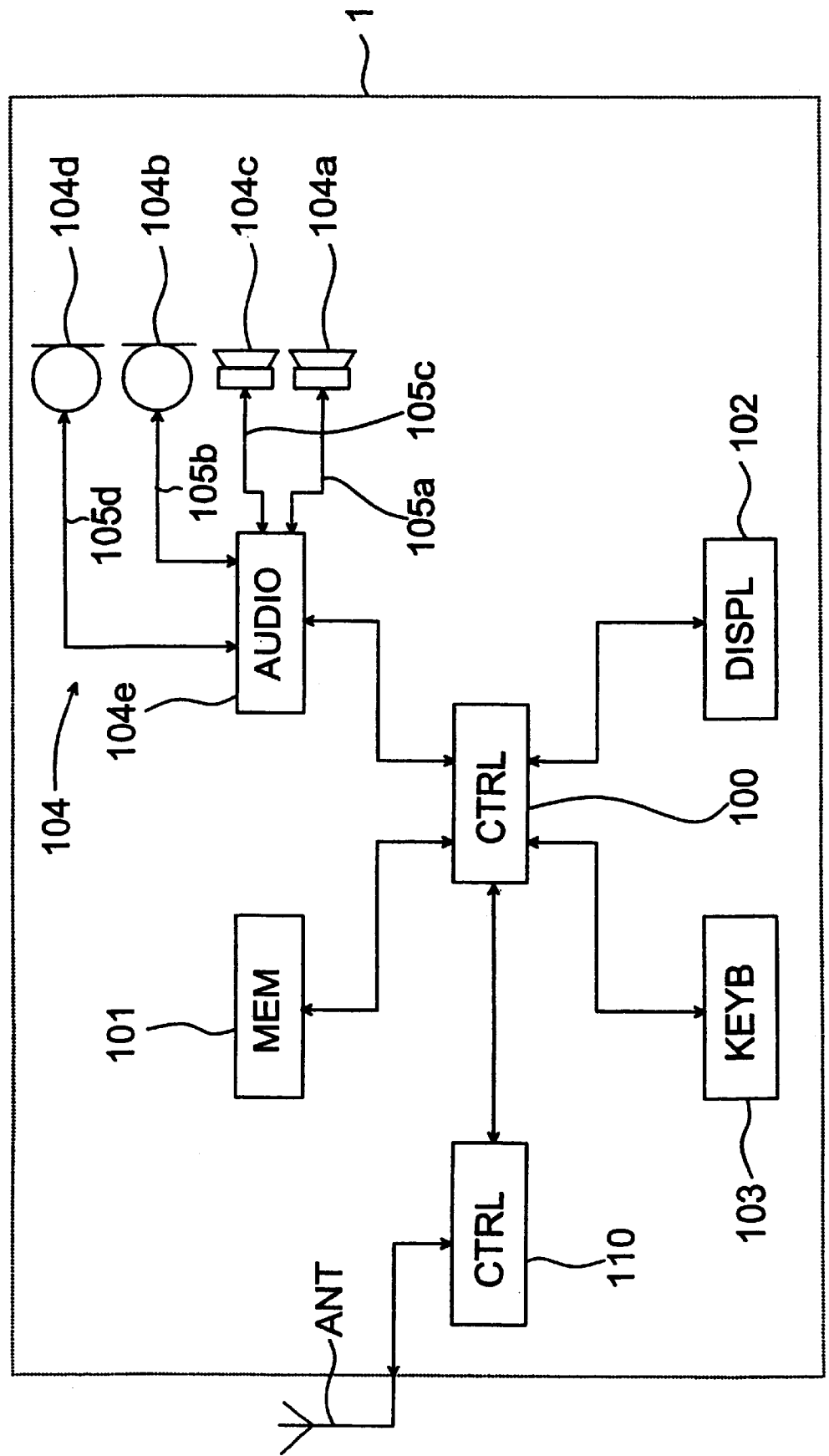
FIG. 1 shows, in a chart, various functional blocks in an electronic device of prior art, particularly in a wireless communication device, in which the invention can be applied.

FIG. 1 shows the control means of an electronic device of prior art, particularly a wireless communication device, in a reduced block chart. The wireless communication device 1 comprises e.g. a control unit 100, memory means 101, display means 102, and input means 103. The display means 102 correspond to e.g. the display means of the device, and the input means 103 correspond to e.g. the keypad means, such as the keypad and other control means. In addition, the chart presents audio means 104, such as an earpiece 104a and a microphone 104b as well as an audio block 104e e.g. for converting a microphone signal from analog to digital and converting the signal to be led to the earpiece 104 from digital to analog. In some devices, the audio means 104 can also comprise an additional earpiece, a buzzer or a speaker 104c and an additional microphone 104d. The memory means 101 comprise e.g. a random access memory (RAM) particularly for storing information needed during the use of the device 1, and a read only memory (ROM) particularly for storing software.

The control unit 100 comprises e.g. a microcontroller unit (MCU) and a programmable logic circuit (application specific integrated circuit, ASIC), and it is also coupled to the control blocks controlling other functions of the wireless communication device 1, such as a control block 110 or the like, for example for controlling the receiving and transmitting functions, the input/output (I/O) functions as well as the radio parts of the device. In the transmission and reception of radio signals, an antenna ANT is used. The operating principle of the wireless communication device 1 are known as such for anyone skilled in the art, wherein a more detailed description will not be necessary. For example, the audio block 104e can be formed, in a known manner, by means of an integrated circuit or several integrated circuits which are fixed on a circuit board to be fitted in the device 1. Furthermore, the circuit board is provided with strip conductors for conveying electrical signals between e.g. the integrated circuits and e.g. the earpiece 104a. The earpiece 104a, i.e. the above-mentioned electroacoustic transformer, must further be arranged in a contact with a strip conductor, for which the present invention provides a very advantageous arrangement. The invention also makes it possible to provide the connections 105a, 105b, 105c and 105d for transmitting electrical signals shown in FIG. 1. It is obvious that the invention can also be applied in forming electrical contacts between other separate components and the circuit board of the device 1.

PC boards are used particularly in electronics as a mounting base for components. Conductive patterns printed on PC boards are used at least partly to replace separate wires for coupling components electrically. The material of the conductive patterns is normally a copper film. A very common material for PC boards is glass fibre reinforced epoxy resin, and in demanding microwave frequency applications, also glass fibre reinforced PTFE plastics is used. One material alternative for PC boards is aramid fibre reinforced epoxy resin. The board material simultaneously forms an electrical insulator. Multilayer printed boards can comprise two or more board layers which are joined e.g. in a press by means of heat. Between the board layers are located conductive patterns whose electrical contact to the components fixed on the surface of the PC board is implemented with through-holes extending through one or more board layers. The structure and manufacture of circuit boards are known as such for anyone skilled in the art, wherein a more detailed description will not be necessary.

Figure 2:
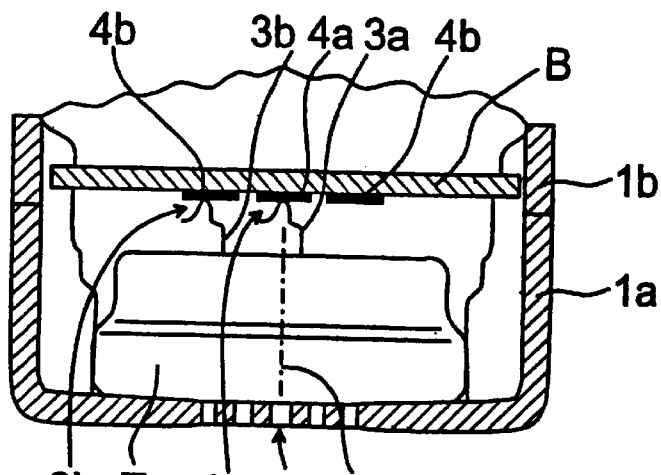
FIG. 2 shows, in a cross-section, a part of a device according to prior art, illustrating the placement of a circuit board and an electroacoustic transformer.

FIG. 2 shows, in a cross-section and a partial view, the placement of a transformer T according to prior art and a circuit board B in an electronic device, for example a wireless communication device 1, such as a mobile phone, as shown in FIG. 1. The transformer T is installed in a mounting place fitted in the first cover part 1a of the device 1, and the circuit board B is fitted in a second cover part 1b. It is obvious that the structure of the cover parts and, for example, the placement of the circuit board can vary in different devices, wherein the design shown in FIG. 1 is only used as an example. The transformer T has normally a round shape, and in the presented example, the first contact spring 3a is placed substantially centrally in the transformer T. Via the contact spring 3a, an electrical signal is conveyed to the transformer T, functioning for example as an earpiece or as a microphone. Through holes H fitted in the cover part 1a, acoustic signals can enter the transformer T functioning as a microphone, or are transmitted to the environment from the transformer T functioning as an earpiece. The internal operation and structure of the transformer T are known as such for anyone skilled in the art. The design of the contact springs 3a and 3b can also vary from the presented bent strip-like shape which is used as an example of a possible shape. The contact springs can be fixed to the transformer T in a stationary manner, or they can be detachable from the same in a way known as such. The springs can be fixed to the transformer T, e.g. its strip-like connector, for example by means of a spring-like crimp connection.

The distance between the transformer T and the circuit board B is fitted in the assembly in such a way that a contact spring 3a is pressed against the contact surface 4a. A second contact spring 3b, which is located further away, is simultaneously pressed against the contact surface 4b. The contact surfaces 4a and 4b are arranged on the circuit board B. Between the contact spring 3a and the contact surface 4a, a mechanical contact 2a is formed for the transmission of an electrical signal, and between the contact spring 3b and the contact surface 4b, a mechanical contact 2b is formed for the transmission of an electrical signal. In different positions of the transformer T, the spring 3b is placed on the periphery of a circle whose radius corresponds to the distance between the rotation axis Y of the transformer, which typically corresponds to its symmetry axis, and the spring 3b. Thus also the contact surface 4b must be arranged in the shape of an endless circumference. The circuit board B and at the same time the contact surfaces 4a and 4b are arranged to be substantially transverse to the axis Y. It is obvious that the design of the contact surface may vary.

Figure 3:
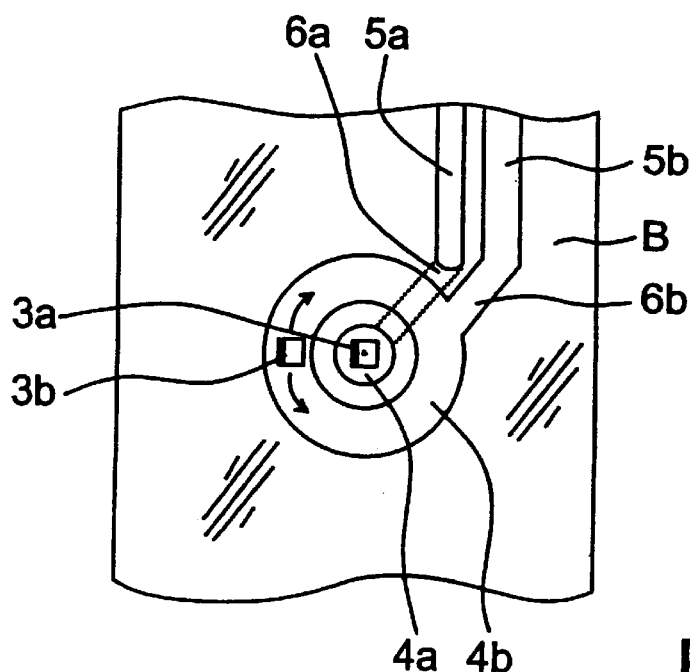
FIG. 3 shows, in a partial view, the circuit board of FIG. 2 and an embodiment of its contact surfaces, seen from above.

FIG. 3 shows an arrangement of the contact surfaces 4a and 4b according to, prior art on the circuit board B, wherein the surface 4a constitutes a surface having a circular shape and the surface 4b constitutes a surface having an annular endless shape. The surface 4b can be in direct contact with conductive patterns, such as a strip conductor 5b, placed on the circuit board, for example by means of a strip conductor 6b. The connection of the surface 4a to the conductive patterns, e.g. to a strip conductor 5a, must be arranged by means of a strip conductor 6a, indicated with a broken line, formed on the lower surface of the circuit board B or between the board layers of a multilayer printed circuit board, and by means of through-holes. The conductor 6a can also be formed on the upper surface of the circuit board B, but in this case a separate insulator must be formed between the conductor 6a and the surface 4b.

Figure 4:
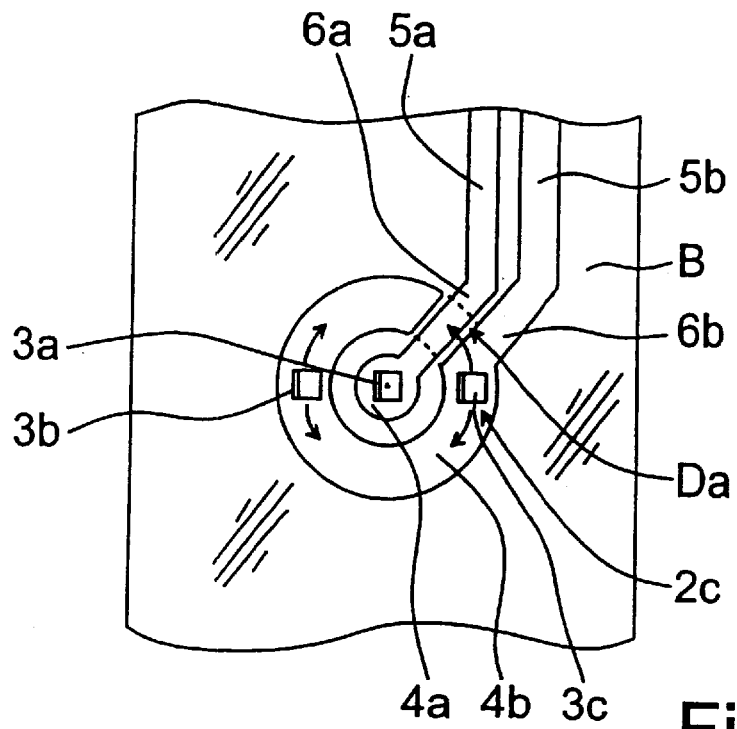
FIG. 4 shows, in a partial view, the circuit board of FIG. 2 and an embodiment of its contact surfaces, seen from above, applying the arrangement according to the invention.

FIG. 4 shows an alternative way of forming the contact surface 4b, wherein it is provided with one point of discontinuity D1 which cuts the annular shape of the surface 4b and through which the surface 4a and the conductor 5a can be connected by means of a conductor 6a formed on the upper surface of the circuit board. Thus, the surfaces 4a, 4b and the conductors 5a, 5b, 6a, 6b can be located on the same level. On top of the conductor 6a at the point of discontinuity D1, which is indicated with a broken line, there is preferably an insulation layer provided to prevent an electrical contact between the contact spring 3b and the conductor 6a as shown in FIG. 2. According to prior art, the transformer T must, however, be always set in such a position that the contact spring 3b is placed on the surface 4b and not at the point Da.

FIG. 3 shows, in a skeleton diagram, also the location of the springs 3a and 3b (without the transformer T) in one position of the transformer T according to FIG. 2. It is seen that the rotary position of the transformer T around the axis Y may vary, but the spring 3b maintains a contact to the surface 4b. The extent of the surface 4a also causes that the spring 3a does not need to be positioned precisely on the axis Y. FIG. 4 shows, in a skeleton diagram, the position of the spring 3a and 3b (without the transformer T) in one position of the transformer T according to FIG. 2. It is shown that in one rotary position of the transformer T, the spring 3b can be located at the point of discontinuity Da, wherein no electrical contact is formed between the surface 4b and the transformer T.

Figure 5:
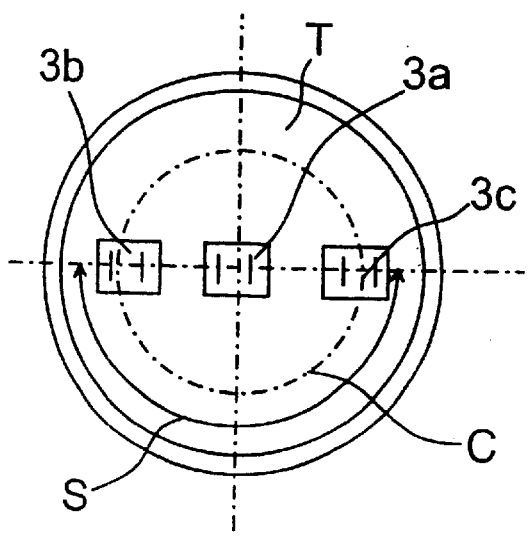
FIG. 5 shows an arrangement according to the invention applied in connection with an electroacoustic transformer and seen from below.

FIG. 4 also shows a contact spring 3c of the arrangement according to the invention, which is, together with the contact springs 3a and 3b, fitted in the transformer T according to the invention, which is shown in FIG. 5. The operation of the contact spring 3c corresponds to the operation of the spring 3b, but it is located in such a manner that the contact 2c corresponding to the contact 2b on the surface 4b is now formed simultaneously or alternatively with the spring 3c. The springs 3b and 3c are placed preferably in a fixed position in relation to each other in such a way that at least one of them is always in contact with the surface 4b in the different rotary positions of the transformer T. As the axis Y extends through the central point of the surface 4a, the sector angle of the springs 3b and 3c is preferably greater than the sector angle covered by the point Da. Thus, the springs 3b and 3c can, at a maximum, be located on opposite sides of the spring 3a. If the point Da is very narrow, it is possible, to replace the spring 3a, to form also two contact points in the spring 3b to make a contact, the distance between the points being greater than the width of the point Da in the direction of the periphery, wherein at least one contact corresponding to the contact 2b is formed in the spring 3b to the surface 4b. The springs 3b and 3c are preferably in an electrical contact to each other for example by means of the internal structure of the transformer T. It is obvious that the transformer T can also be equipped with several attachment locations for the contact spring 3b and/or the contact spring 3b, wherein the advantage is that the position between the springs is adjustable, if the sector angle covered by the annular contact surface 4b varies in different devices.

FIG. 5 shows the arrangement according to the invention, seen from below, in a component, such as an electroacoustic transformer T, wherein one contact spring 3a is placed substantially on its axis of symmetry, and contact springs 3b and 3c are placed at opposite sides on the circumferential periphery C. The sector angle S between the contact springs 3b and 3c is about 180 degrees in the embodiment of FIG. 5. It is obvious that the springs 3a, 3b, 3c can be placed in a corresponding manner also on the circuit board, wherein the transformer T is equipped for example with contact surfaces 4a and 4b according to FIG. 4 for the contacts 2a and 2b which are formed at the contact point between the surface and the contact spring. Furthermore, it is obvious that the transformer T can, according to the invention, be provided with springs 3b and 3c of FIG. 6, as well as springs 3d and 3e, if there are only the annular contact surfaces 4b and 4c, equipped with opening locations, in use on the circuit board B. In this case, the contact surface 4b can also be continuous without a point of discontinuity Da, if no contact surface 4a is formed inside the surface 4b.

Figure 6:
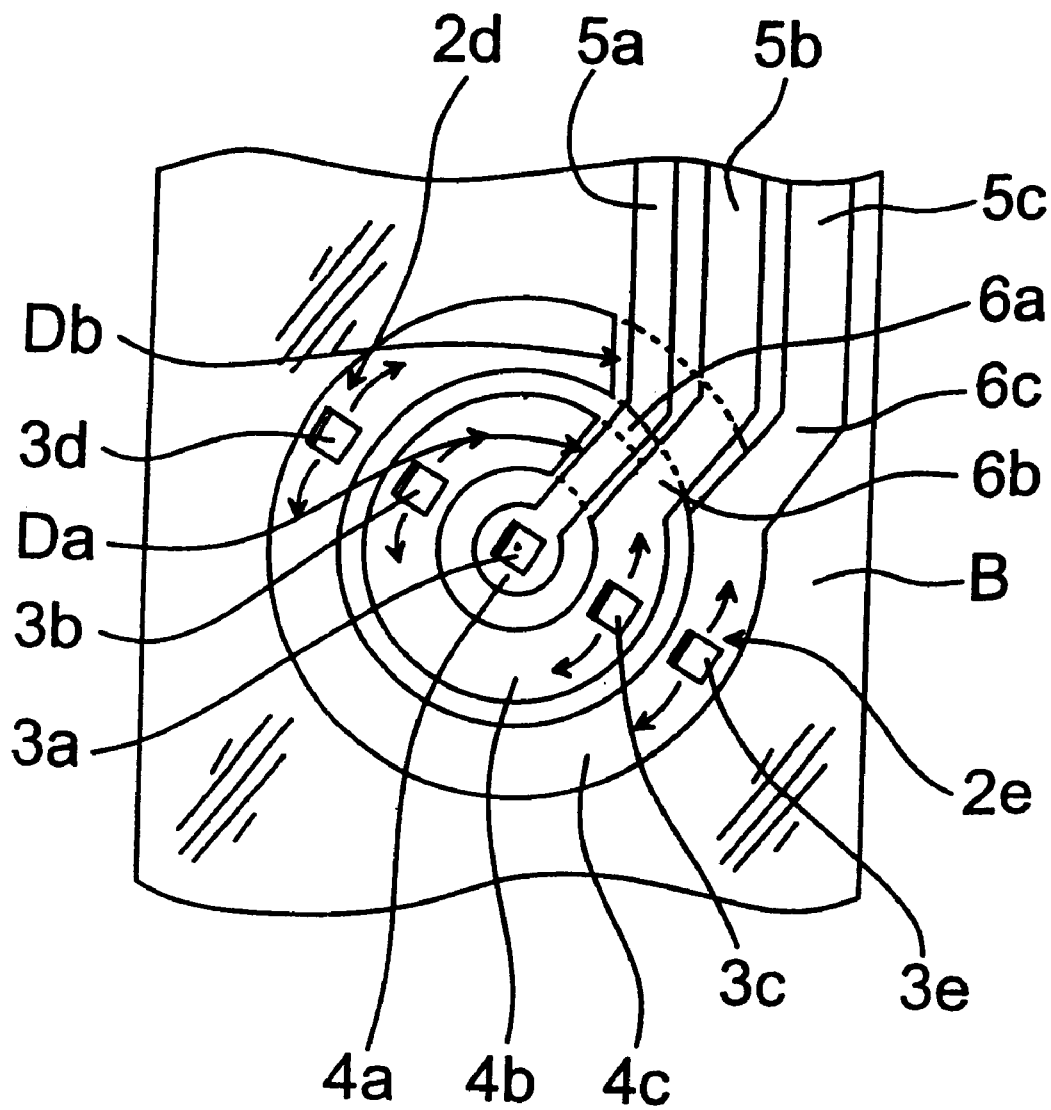
FIG. 6 shows, in a partial view, the circuit board of FIG. 2 and an embodiment of its contact surfaces, seen from above, applying the arrangement according to the invention.

FIG. 6 shows yet another alternative for forming the contact surfaces, wherein an annular contact surface 4c, comprising a point of discontinuity Db, is formed for the contact around the contact surface 4b. By means of the surfaces 4a, 4b and 4c, it is now possible to transfer three separate electrical signals between the transformer T and the circuit board B. The surface 4c can be in direct contact with the strip conductor 5c, for example by means of a strip conductor 6c formed on the upper surface of the circuit board B. Because the different contact springs can, in different positions of the transformer T, be also located at the points Da and Db, these points must be provided with an insulation layer or the conductors 6b and 6c must be provided with an insulating coating. According to the invention, the transformer T is now fitted with contact springs 3d and 3e for securing the contact in the different positions of the transformer T. The respective positioning of the springs 3d and 3e follows the principles presented in connection with the springs 3b and 3c. A mechanical contact 2d is formed between the contact spring 3d and the contact surface 4c, and a contact 2e is formed between the contact spring 3d and the contact surface 4c. For each annular contact surface, at least three contact springs must be provided preferably at regular intervals, if the surface covers less than a half but more than a third of a full circle.

According to the same principle, at least four contact springs must be arranged for each annular surface, if the surface covers less than a third but more than a quarter of a full circle.

Figure 7:
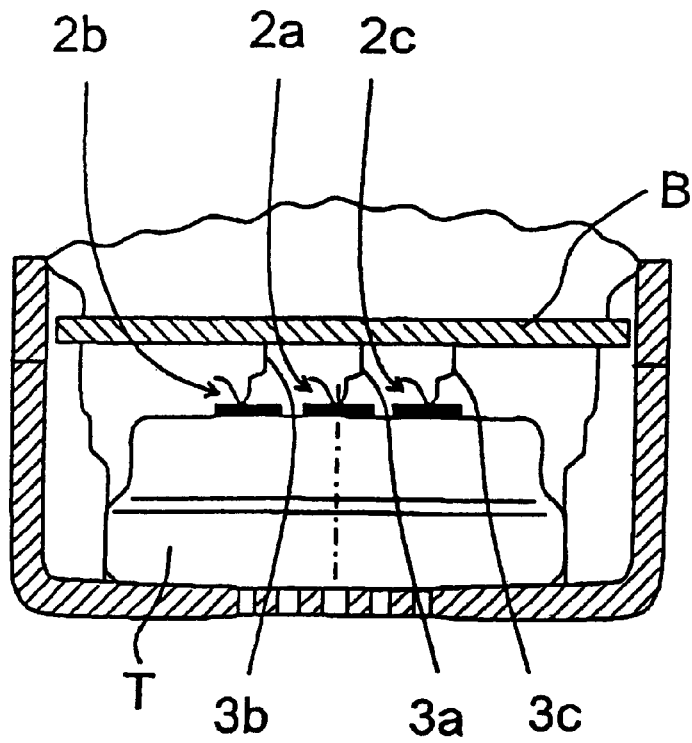
FIG. 7 shows a situation corresponding to FIG. 4 but in such a way that the contact springs are now attached to the circuit board B and the contact surfaces are on the surface of the component T. According to the features of the present invention, the structure of FIG. 7 is supplemented with the contact spring 3c as compared with the structure of FIG. 2.

FIG. 7 shows a situation corresponding to FIG. 4 but in such a way that the contact springs are now attached to the circuit board B and the contact surfaces are on the surface of the component T. According to the features of the present invention, the structure of FIG. 7 is supplemented with the contact spring 3c as compared with the structure of FIG. 2.

Figure 8:
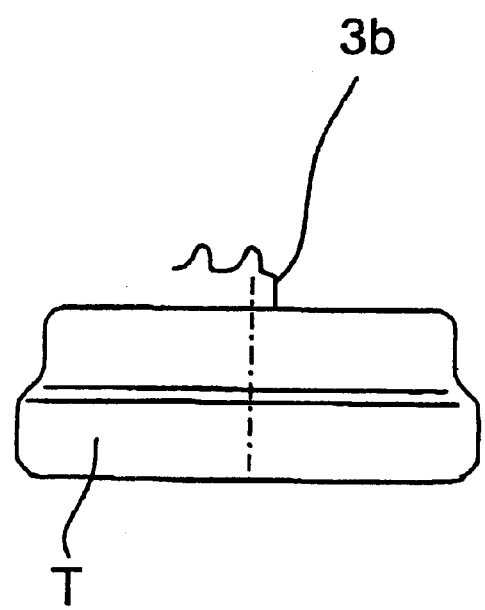
FIG. 8 shows a situation, in which the contact spring 3b is attached to the component as in FIG. 2 but two contact points are now provided by means of one contact spring, because it comprises two U or V shaped structures in the same construction. Consequently, by means of the contact spring 3b shown in FIG. 8, both the contact point 2b and the contact point 2c are provided, wherein the contact spring 3c will not be necessary but it may still be included in the structure.

FIG. 8 shows a situation, in which the contact spring 3b is attached to the component as in FIG. 2 but two contact points are now provided by means of one contact spring, because it comprises two U or V shaped structures in the same construction. Consequently, by means of the contact spring 3b shown in FIG. 8, both the contact point 2b and the contact point 2c are provided, wherein the contact spring 3c will not be necessary but it may still be included in the structure.

It will be obvious for anyone skilled in the art that the invention is not limited solely to the embodiments presented above but it may vary within the scope of the claims. The presented component can not only be an electroacoustic transformer but also another electronic component which can be placed in different rotary positions and which is coupled by means of an electrical contact to a circuit board. The above-presented electronic device can not only be a wireless communication device but also another device, such as a computer, a portable data processor or, for example, a combination of a data processor and a telephone device. Said electronic device can also form a functional partial unit of another device. Said wireless communication device is preferably a mobile phone which operates in a system based on a cellular network and which can be connected to a communication network, such as a GSM network (Global System for Mobile Communication).

What is claimed is:

1. An arrangement for an electronic device for electrically coupling a component to a circuit board, the arrangement comprising (i) a first contact spring, (ii) a contact surface arranged as a conductive, annular surface including at least one non-conductive point of discontinuity, and (iii) a contact point on the surface between the first contact spring and the contact surface, wherein for a different rotated position of the component, the contact point is situated at a different location by rotation of the component, at least one alternative contact point between a second and separate contact spring and the contact surface, the contact points being situated on the surface in such a way that simultaneously at least one of the contact points is located on the conductive contact surface in different rotated positions of the component.

2. An arrangement according to claim 1, wherein at least two separate contact springs are arranged whereby simultaneously at least one of said contact springs forms a contact point with said contact surface in different positions of said component.

3. An arrangement according to claim 2 wherein said contact springs are fitted on said component and said contact surface is formed on said circuit board, and further wherein said contact surface is arranged as a conductive, annular surface comprising at least one non-conductive point of discontinuity.

4. An arrangement according to claim 3 wherein around said first annular contact surface a second annular contact surface is formed for coupling said component electrically to the circuit board by means of a contact point positioned between a contact spring and said second contact surface.

5. An arrangement according to claim 1 wherein said component is provided with at least one contact spring located substantially centrally and at least two contact springs located in an annular manner.

6. An arrangement according to claim 1 wherein said contact springs are fitted on said circuit board and said contact surface is formed in said component.

7. An arrangement according to claim 1, wherein at least two contact points are arranged in the same contact spring.

8. An electroacoustic transformer comprising a first contact spring centrally located and arranged for electrically coupling the transformer to a first contact surface of a circuit board, and a second non-centrally located contact spring arranged for coupling the transformer electrically to a second contact surface of the circuit board wherein the contact surface is arranged as a conductive, annular surface comprising at least one non-conductive point of discontinuity, and further wherein the transformer is provided with the second contact spring, at least one third contact spring also arranged for coupling the transformer electrically to the second contact surface of the circuit board the second contact spring and the third contact spring being non-centrally arranged whereby simultaneously at least one of the contact springs forms a contact point with the contact surface in different positions of the component.

9. A wireless communication device, comprising an arrangement for electrically coupling a component to a circuit board by means of a contact point between a contact spring and a contact surface arranged as a conductive, annular surface comprising at least one non-conductive point of discontinuity, wherein the arrangement further comprises, for securing the coupling for different rotary positions of the component, wherein the contact point is situated at a different location, at least one alternative contact point between an additional contact spring and the contact surface wherein the contact points are situated whereby simultaneously at least one of the contact points is located on the conductive contact surface in different rotated positions of the component.

10. In a method for the electrical coupling of a component to a circuit board in an electronic device by means of a contact point between a contact spring and a contact surface arranged in a conductive, annular surface comprising at least one non-conductive point of discontinuity including the step of arranging, for securing the coupling for different rotary positions of the component wherein the contact point is situated at a different location, at least one alternative contact point between an additional contact spring and the contact surface wherein the contact points are situated whereby simultaneously at least one of the contact points is located on the conductive contact surface in different rotated positions of the component.

11. An arrangement for an electronic device for electrically coupling a component to a circuit board, the arrangement comprising (i) a contact spring, (ii) a contact surface arranged as a conductive, annular surface including at least one non-conductive point of discontinuity, and (iii) a contact point between the contact spring and the contact surface, the arrangement further comprising, for securing the coupling for different rotated positions of the component, wherein the contact point is situated at a different location, at least one alternative contact point between the said contact spring and the contact surface, wherein the contact points are situated in such a way that simultaneously at least one of the contact points is located on the conductive contact surface in different rotated positions of the component, wherein the contact points are situated at a different location.

12. An arrangement according to claim 11, wherein said contact spring is fitted in said component and said contact surface is formed on said circuit board.

13. An arrangement according to claim 12 wherein said circuit board is a flexible circuit board.

14. An arrangement according to claim 12, wherein around said first annular contact surface, a second annular contact surface is formed for coupling said component electrically to the circuit board by means of a contact point between a contact spring and said second contact surface.

15. An arrangement according to claim 11, wherein said component is provided with at least one, centrally located contact spring.

16. An arrangement according to claim 11, wherein said contact spring is fitted on said circuit board and said contact surface is formed on said component.

* * * * *